United States Patent [19]

Bourgoin

[11] 4,325,795

[45] Apr. 20, 1982

[54] PROCESS FOR FORMING AMBIENT TEMPERATURE SUPERCONDUCTING FILAMENTS

[76] Inventor: Ronald C. Bourgoin, 18 Woodfern Cir., Greenville, S.C. 29615

[21] Appl. No.: 202,680

[22] Filed: Oct. 31, 1980

[51] Int. Cl.³ .............................................. C25B 7/00
[52] U.S. Cl. ........................... 204/180 R; 204/181 R; 204/181 F; 204/299 R; 204/300 R; 427/58; 427/62; 427/63; 174/126 S; 264/24; 264/26; 264/27
[58] Field of Search ........... 204/180 R, 181 R, 181 F, 204/299 R, 300 R; 427/58, 62, 63; 174/126 S; 264/24, 26, 27

[56] References Cited

U.S. PATENT DOCUMENTS

| | | | |
|---|---|---|---|
| 3,449,227 | 6/1969 | Heron et al. | 204/180 R |
| 3,449,230 | 6/1969 | Heron et al. | 204/180 R |
| 3,556,969 | 1/1971 | Mizuguchi et al. | 204/180 R X |
| 3,626,041 | 12/1971 | Fields et al. | 264/24 |
| 3,664,938 | 5/1972 | Thomas et al. | 204/180 R |
| 3,668,096 | 6/1972 | Cook | 204/180 R X |
| 4,048,037 | 9/1977 | Chronberg | 204/180 R |

*Primary Examiner*—Arthur C. Prescott
*Attorney, Agent, or Firm*—Mills and Coats

[57] ABSTRACT

This invention is a process for forming electrical conductors in the form of filaments which exhibit properties of electrical superconductivity at ambient or normal room temperature. The process includes the preparation of a molten mixture of conducting and insulator materials, the introduction of the nearly homogeneous mixture between electrodes across which a voltage is applied causing fine filaments to be formed having a diameter within the range of 10 to 1,000 Å. The filaments thus formed give almost no resistance to the passage of the electricity therethrough at room temperature thus effectively forming an ambient temperature superconductor.

11 Claims, 8 Drawing Figures

PROCESS FOR FORMING AMBIENT TEMPERATURE SUPERCONDUCTING FILAMENTS

FIELD OF INVENTION

This invention relates to electrical conductors and a method of forming the same and more particularly to electrically conducting filaments of submicron diameter for superconducting of electricity therethrough.

BACKGROUND OF INVENTION

Some metals, metalloids, alloys and metallic compounds, when placed in near Absolute Zero thermal environments, undergo significant decreases in ohmic resistance; at a certain temperature, or within a narrow range of temperatures—termed a materials's "transition temperature" or "transition temperature range"—the ohmic resistance falls abruptly to practically zero. For a conductor of a given length and cross-sectional area with a measured R ohms of resistance at 25° C., the resistivity is determined to be a certain magnitude. As the ambient temperature of the conductor is decreased, it has been found that there occurs a linear decrease in resistivity with temperature. Such linear behavior, however, is not the phenomenon of superconductivity. Superconductivity is the term applied to the sudden departure from linear behavior and the abrupt attainment of near zero ohmic resistance. At this point, it is said that the conductor has entered the "superconducting state", and it has been found that said conductors in said state are capable of passing very large magnitudes of current with a minimum of applied voltage.

Although it has been theorized that ambient or room temperature superconductivity might be possible, until now this has remained theory only although such diverse uses as high voltage long distance transmission lines, heat transfer means for heat pumps, and by-passes of damaged nerves in the spinal column have been envisioned.

BRIEF DESCRIPTION OF INVENTION

After much research and study into the phenomenon of superconductivity and the problems associated therewith in obtaining the same at ambient temperature, the present invention has been developed which accomplishes this condition at 25 to 30 degrees Centigrade. This is done through the use of extremely fine filaments having a diameter of between 10 and 1,000 Å formed from elements which normally have a high resistance to current flow. Through practice of the method taught by the present invention, it is now practical to consider not only building electrical transmission long lines, spinal cord by-passes and improved heat transfer means for heat pumps, but also many other applications in such fields as microelectronics and computer technology.

In view of the above, it is an object of the present invention to provide a method of producing a filament which will superconduct at temperatures substantially above zero K.

Another object of the present invention is to provide a superconducting filament which does not lose its superconductivity at temperatures even above zero degrees Centigrade.

Another object of the present invention is to provide a method for producing filaments having a diameter of between 10 and 1,000 Å which exhibit characteristics of superconductivity at room temperature.

Another object of the present invention is to provide a practical method for producing fine filament conductors which have superconducting qualities.

Other objects and advantages of the present invention will become apparent and obvious from a study of the following description and the accompanying drawings which are merely illustrative of such invention.

DETAILED DESCRIPTION OF INVENTION

Figure 1:
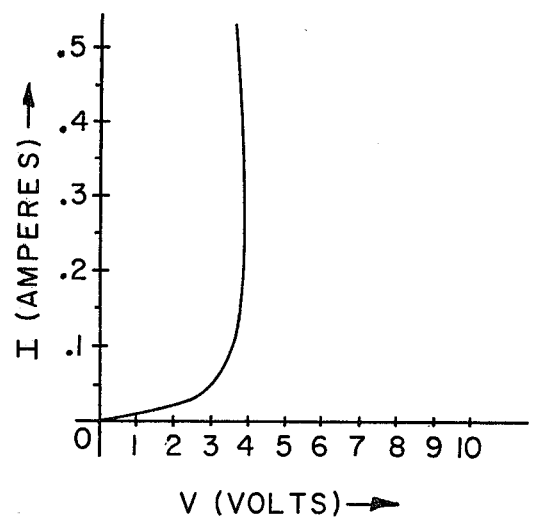
FIG. 1 is a graph illustrating observed increase in current as voltage increases.

If a DC voltage V volts is applied across the ends of a conducting material of uniform length L centimeters and cross-sectional area A square centimeters in an ambient temperature environment of T °C. by means of an ammeter it is found that a current of I amperes is passed by the conductor. By means of Ohm's Law, the resistance R ohms offered to the passage of electric current is found by $$R = V/I. \qquad (1)$$

If a constant DC voltage V volts is applied across the ends of various materials of equal uniform lengths and cross-sectional areas at constant temperature, it is found that each material passes a different current I. By the use of equation (1), the resistance offered to current flow can be determind for each material. This leads to the conclusion that resistance is determined by the conducting property of each material. For the purpose of comparison of conducting properties of various materials at constant temperature, a coefficient of resistance, $\rho$—termed the "resistivity"—is calculated by the use of $$\rho = (R \times L)/A. \qquad (2)$$

If R is in units of ohms, L in centimeters, and A in square centimeters, $\rho$ is in units of ohm-centimeter.

The resistivities of several metals at 20° C. as taken from "Properties of Metals as Conductors", *Handbook of Physics and Chemistry*, CRC Press, 1979-80, are given below:

| METAL | RESISTIVITY ($\times 10^{-6}$ ohm − cm) |
| --- | --- |
| Aluminum | 2.824 |
| Bismuth | 120.0 |
| Copper; Annealed | 1.7241 |
| Gold | 2.44 |
| Iron, 99.98% pure | 10.0 |
| Lead | 22.0 |

-continued

| METAL | RESISTIVITY ($\times 10^{-6}$ ohm – cm) |
|---|---|
| Mercury | 95.783 |
| Monel metal | 42.0 |
| *Nichrome | 100.0 |
| Nickel | 7.8 |
| Silver | 1.59 |
| Tin | 11.5 |
| Tungsten, drawn | 5.6 |
| Zinc | 5.8 |

*Trademark

According to the conventional view of the nature of resistivity, examination of the above table reveals that silver is the best conductor of electricity. Bismuth has nearly 75½ times the resistivity of silver and is hence considered that much poorer a conductor.

The chief cause of resistance in a metal crystal is thought to be due to the collisions of electrons in a current flow with the vibrating lattice. From the Boltzmann form equating mechanical energy to thermal energy, $$\tfrac{1}{2} MV^2 = KT \tag{3}$$

Where M = mass of a particle in the lattice structure, in grams; V = velocity of the particle, in cm/sec; K = Boltzmann's constant, $1.38 \times 10^{-16}$ erg/°K, and T = absolute temperature, °K. A lattice electron of mass $9.11 \times 10^{-28}$ gram at room temperature, 300° K., will vibrate at a rate of $$V = \sqrt{\frac{2KT}{M}} = \sqrt{\frac{2 \times 1.38 \times 10^{-16} \times 300}{9.11 \times 10^{-28}}} = .95 \times 10^7 \text{ cm/sec} \tag{4}$$

This is commonly referred to as the thermal agitation velocity.

The current flow velocity, or the drift velocity, is found by the use of the current equation $$I = ANeV \tag{5}$$

where
I = magnitude of current, in amperes
A = conductor cross-sectional area, in square centimeters
N = conduction electron density: electrons/cm³
E = charge of one electron: $1.6 \times 10^{-19}$ coulomb/electron
V = drift velocity Using copper as an example, where $N = 8.42 \times 10^{22}$ conduction electrons per cm³: if a current of one ampere is passed in a wire of cross-sectional area 0.01 cm², $$V = \frac{1}{.01 \times 8.42 \times 10^{22} \times 1.6 \times 10^{-19}} = 7.423 \times 10^{-3} \text{ cm/sec} \tag{6}$$

This is about nine orders of magnitude below the velocity of thermal agitation at room temperature.

It has been found that by cooling materials, the resistivity is decreased. The reduction in resistivity is attributed to the reduced rates of lattice vibrations resulting in increased drift velocity. For many materials, a plot of resistivity versus temperature as the material is cooled to very low temperatures reveals a linear relationship. Some materials, however, on approaching absolute zero (0° K.), suddenly lose nearly all trace of electrical resistance. It is said that the materials have then entered the "superconducting state". The temperature at which, or the range of temperature within which this practically resistanceless condition is attained is called the material's "transition temperature(s)". Most metals which have been found to exhibit this behavior do so below 10° K.; many of the alloys and metallic compounds do so below 20° K.

Tin, for example, has been found to enter the superconducting state at 3.69° K. Although a sudden drop in resistance is observed at that temperature, it is found that some ohmic resistance exists in the metal. By the use of equation (3), the thermal agitation velocity at 3.69° K. is found to be $$V = \sqrt{\frac{2 \times 1.38 \times 10^{-16} \times 3.69}{9.11 \times 10^{-28}}} = 1.057 \times 10^6 \text{ cm/sec.} \tag{7}$$

Attempts have been made to completely eliminate the ohmic resistance in conductors, but at the lowest temperatures yet attained—about $10^{-8}$ °K.—traces of electrical resistance can still be found. By the use of equation (3), the thermal agitation velocity at $10^{-8}$ °K. is $$V = \sqrt{\frac{2 \times 1.38 \times 10^{-16} \times 10^{-8}}{9.11 \times 10^{-28}}} = 55.04 \text{ cm/sec} \tag{8}$$

Not until the absolute zero of temperature is attained, it is expected, will a completely resistanceless conductor be obtained.

The conducting behavior of a material below its transition temperature is described on the basis of the "two-fluid" model of superconductivity: one "fluid" consists of electrons in a normal conduction process expected at the particular ambient temperature of the conductor; the other consists of high speed electrons whose passage along the conductor is apparently unimpeded.

From the work of J. Bardeen, L. N. Cooper, and J. R. Schrieffer *Physical Review*, 108, 1175 (1957), the high speed electron flow component consists of paired electrons with oppositely directed spins. These pairs can pass along the conductor with velocities in excess of the thermal agitation velocity tending to disrupt their flow. It has been postulated that the fast electron component has a flow velocity of the order of $10^7$ cm/sec.

It appears reasonable to treat conduction electron flow as a fluid flow. Considering the conduction electron density of copper found in (6), the particle density is within range of particle densities in fluid media.

All fluids exhibit viscosity, or internal friction (resistance). Just as a coefficient of viscosity (fluid resistivity) can be determined for a material fluid, R. L. Carroll *The Eternity Equation* (1976) derived an expression for a coefficient of electronic viscosity (electrical resistivity). The form is $$\mu = N\left(\tfrac{1}{2} \frac{h}{2\pi}\right) \tag{9}$$

Where
N = number of electrons paired with like spins per cm³
h = Planck's constant: $6.625 \times 10^{-27}$ erg-sec.

$\mu$ = coefficient of electronic viscosity, spin/cm$^3$

It can be deduced from (9) that if paired electrons with opposite spins can be formed, N can be reduced, and, subsequently, $\mu$(electrical resistivity). The attractiveness of Carroll's development is that resistivity reduction is not temperature dependent: pairing of electrons with opposite spins should be possible at any temperature.

Carroll (ibid.) suggested that the desired pairing could be effected if electrons were forced into proximity upon entry into an extremely narrow conductor: said conductor would have to be of a material wherein electron flow velocities under normal conditions of conduction were quite high. If extremely narrow conductors could be created of such a material, the thermal agitation velocity at ambient temperatures would have little effect on the electron pairs. Carroll further expected that forced proximity would cause the electron to pair in an orientation of least potential; i.e., with spins annulling.

Since the attainment of superconductivity, or a close approximation to it, at normal temperatures is very desirable, laboratory investigations of Carroll's theories were performed. The material selected for the thin conductors were bismuth since the metal is known to contribute only one conduction electron per 10$^5$ to 10$^6$ atoms. This places a restricton on N in equation (9). The atomic density of bismuth is 2.82×10$^{22}$ atoms/cm$^3$. If the mid-range of conduction electron contribution is taken to be one per 5×10$^5$ atoms, then the conduction electron density in bismuth is $$2.82 \times 10^{22} \times \frac{1}{5} \times 10^{-5} = 5.64 \times 10^{16} \frac{\text{conduction electrons}}{\text{cm}^3} \quad (10)$$

From equation (5), if one microampere (10$^{-6}$ ampere) is passed along a bismuth conductor of cross-sectional area 10$^{-10}$ cm$^2$, the drift velocity is found to be $$V = \frac{10^{-6}}{10^{-10} \times 5.64 \times 10^{16} \times 1.6 \times 10^{-19}} = 1.108 \times 10^6 \text{ cm/sec} \quad (11)$$

Comparison of (11) with (4) reveals that the drift velocity in bismuth is quite high and that a thin wire of the order of 10$^{-6}$ cm diameter or less can be expected to provide a drift velocity of the order of 10$^8$ cm/sec, or higher; if a current flow velocity of this magnitude could be attained, a large fast-electron component should be attainable at normal temperatures.

The literature of solid state physics was found to contain a few references to resistivity anomalies discovered in thin bismuth wires of 10$^{-4}$ cm diameter: Eucken and Förster, "Göttinger Nachrichten", *Math. Phys. Klasse*, Fachgruppe 2, 1, 43 (1934); and 10$^{-5}$ cm diameter: Gurvitch, *Journal of Low Temperature Physics*, 38, 5/6, 777 (1980). Suppositions have been made to explain the anomalous behavior in these thin bismuth wires but there is no general acceptance of any one reason. If Carroll's spin interaction theory is applied to interpret the observed behavior: due to the high speed current flow in a contracted space, some electrons—by virtue of their proximity—are forced to pair in an orientation of least resistance; the increase in the number of pairs with annulled spins results in a decrease of resistivity. In view of the experimental evidence, it appeared that Carroll might be correct, and it was expected that significant resistivity anomalies would occur in bismuth wires of diameters less than 10$^{-5}$ cm.

The thinnest bismuth wires that have been produced by mechanical techniques are claimed by Gurvitch (ibid.). The employment of his techniques to form wires of 10$^{-6}$ cm diameter, however, would require the application of approximately 22,000 pounds per square inch of pressure.

No practical procedure existed prior to this invention to form wires, or thin conducting filaments, with diameters less than 10$^{-5}$ cm.

Filaments were formed with diameters within the range of 10–1000Å; following their formation, tests were performed at room temperature by applying various magnitudes of low DC voltage across the ends of the filaments, and graphs were made of the recorded current flow through them and the effective resistance offered to current flow by them.

From equation (2), and taking the value of the resistivity of bismuth at 20° C. given in the herein table of resistivities of various metals, the resistance expected from the filaments ranged from 10$^5$ to 10$^6$ ohms. In addition, extrapolation of well-known tables of maximum allowable current carrying capacities of conductors of various cross-section led to the expectation that current of the order of picoamperes (10$^{-12}$ ampere) should be the maximum order of magnitude of current passed by the filaments. It was found, however, that the filaments were capable of passing much higher currents, and most electrical tests were performed by passing currents through each filament within a range of 100–500 milliamps. In some cases, as much as 2 amperes were passed through single filaments.

A typical graph of the increase in current flow with an increase in voltage for many of the samples is provided in FIG. 1. It is observed that at some threshold voltage, the current appears to increase without bound.

Figure 2:
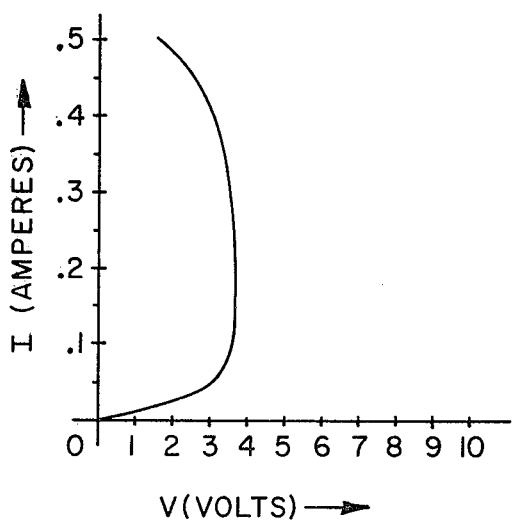
FIG. 2 illustrates how voltage drops as current increases.

In many samples it was observed that, once the threshold voltage was attained, the current flow suddenly increased, as shown in FIG. 1, but the voltage drop across the filaments decreased as the current approached a maximum allowed by power supply. This behavior is illustrated in FIG. 2.

As the threshold voltage was attained, the increase in current flow toward the maximum was sudden. If 100 milliamps were passing through a filament just prior to reaching the threshold voltage, for example, current rose from that value to the maximum available from the power supply within a fraction of a second as the threshold voltage was reached.

Figure 3:
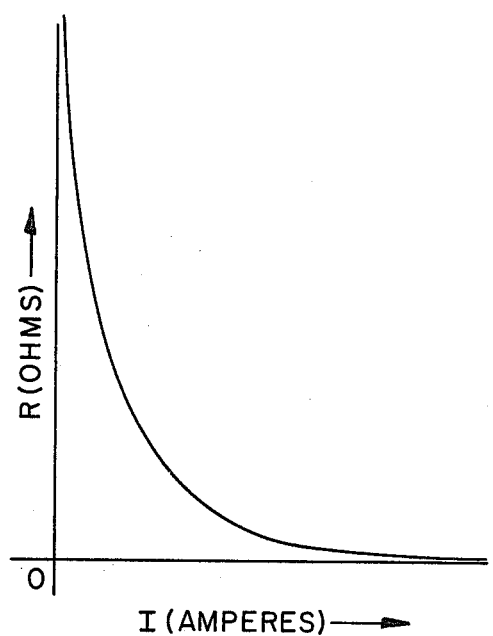
FIG. 3 is a graph illustrating that as current is increased, resistance decreases.

If the graph is made of the apparent resistance offered to the current flow as said current is increased in most of the samples, it is seen that the resistance is decreased to near zero, as shown in FIG. 3.

Figure 4:
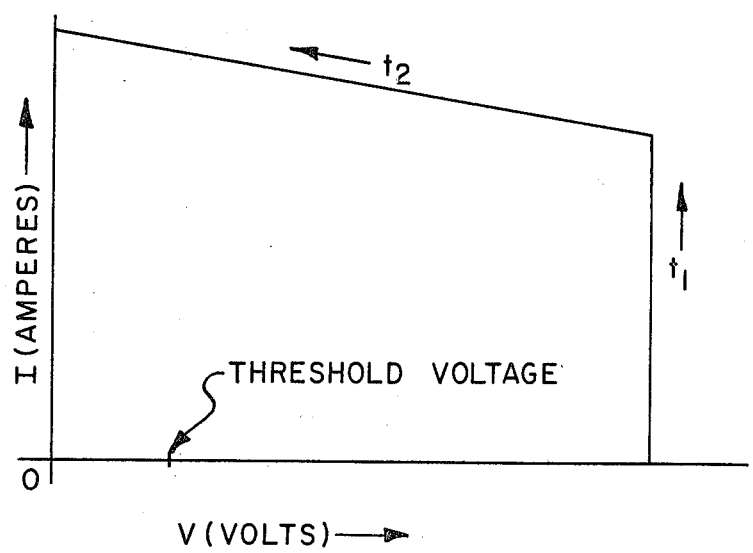
FIG. 4 is a graph showing the tendency of the filaments to pass currents instantly and the voltage to drop toward zero.

For most samples, the threshold voltage was found to be between one and five volts. If a voltage exceeding the threshold was applied to the filaments, and if the power supply was capable of delivering high current, it was found that the filaments passed the permitted currents instantly and the voltage drops across the conductors instantly tended toward zero as illustrated in FIG. 4.

Figure 5:
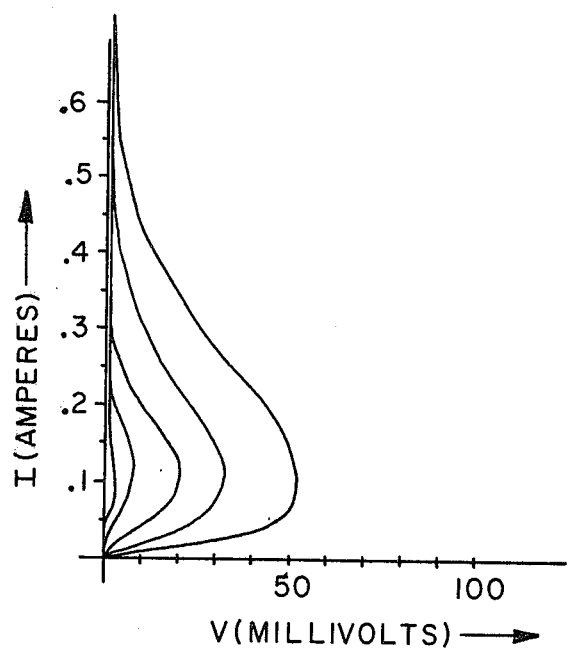
FIG. 5 is a graph illustrating observations made of filaments reaction to current and voltage variations.

A few samples exhibited extremely low resistance during the testing. For them, it was found that the application of only a few millivolts was sufficient to render them to behave in a fashion illustrated in FIG. 1, except that the threshold voltage was much lower, as shown in FIG. 5.

Some samples exhibited no apparent resistance to current flow. The application of a voltmeter across the ends of these filaments as 500 milliamps was passed through them indicated zero voltage drop at an accuracy of $10^{-6}$ volt.

Figure 6:
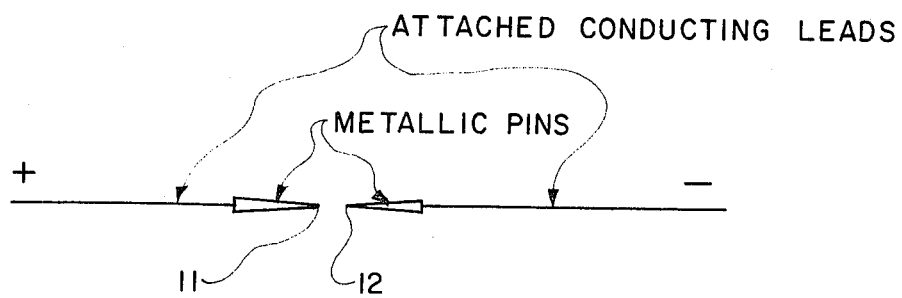
FIG. 6 is a basic filament forming circuit.

FIG. 6 illustrates the basic filament forming apparatus. A voltage is applied across the pin points 11 and 12, and as the filament material is introduced between the points, the intense electrical field forces particles of filament material to migrate between points. Sufficient current is passed through the aligned particles to cause them to fuse into a solid wire.

The attached leads and pins are of ohmic materials, so they will offer some resistance to current flow. Ohmmeter measurements made of the pins and connected leads yielded a total least resistance of one-tenth (0.1) ohm. Following the formation of the practically zero-resistance bismuth filaments, ohmmeter measurements yielded total resistance values of less than one-tenth ohm. When placed in test circuits, graphs made of the applied voltage to the recorded current passed by the filaments and their associated pins and leads resulted in the discovery that the effective resistance was of the order of one-hundreth (0.01) ohm.

Figure 7:
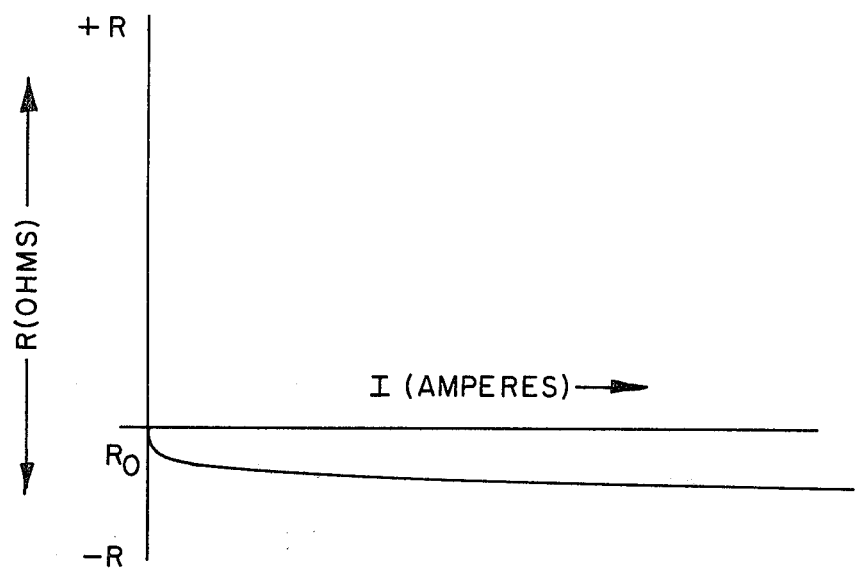
FIG. 7 is a graph showing negative resistance behavior of resistanceless bismuth filament.

If $R_o$ is the measured resistance of a filament and its attached leads and pins prior to its placement in a test circuit, a graph of resistance versus current yielded the typical behavior shown in FIG. 7 when the filament and its associated leads and pins were placed in test circuits.

The least resistance expected was that offered by the pins and the leads, but the discovery that the effective resistance was reduced by a factor of ten lead to the conclusion that the superconducting component was extracting energy from the conductor. The most obvious energy that could be extracted was thermal energy since its extraction would result in decreased resistance to current flow. If this were in fact occurring, it should be possible to detect a higher temperature at one pin than the other. Currents of up to two amperes were passed through the filaments and attached leads, and it was found that significant heat transfer did in fact occur. The hotter junction was found to be that of the electrode of positive potential. Considering that the electrons enter the filament at the point of negative potential and are accelerated upon entry into the filament toward the positive electrode, and considering that the electrons absorb thermal energy from the filament and negative electrode as they pass through them, the electrons' sudden entry into the ohmically resistive positive electrode and subsequent decelerations would cause them to radiate the thermal energy that they had absorbed from the filament and negative electrode. As the thermal energy is radiated into the positive electrode and dissipated into the ambient environment, the overall effect is that of cooling the conducting path to provide decreased resistance to current flow. This leads to the conclusion that if heat could be removed from the hot junction at a greater rate than is possible in a static air environment of 20° C. temperature, the thermal agitation at the hot junction would be decreased to provide an even lower negative resistance effect.

Figure 8:
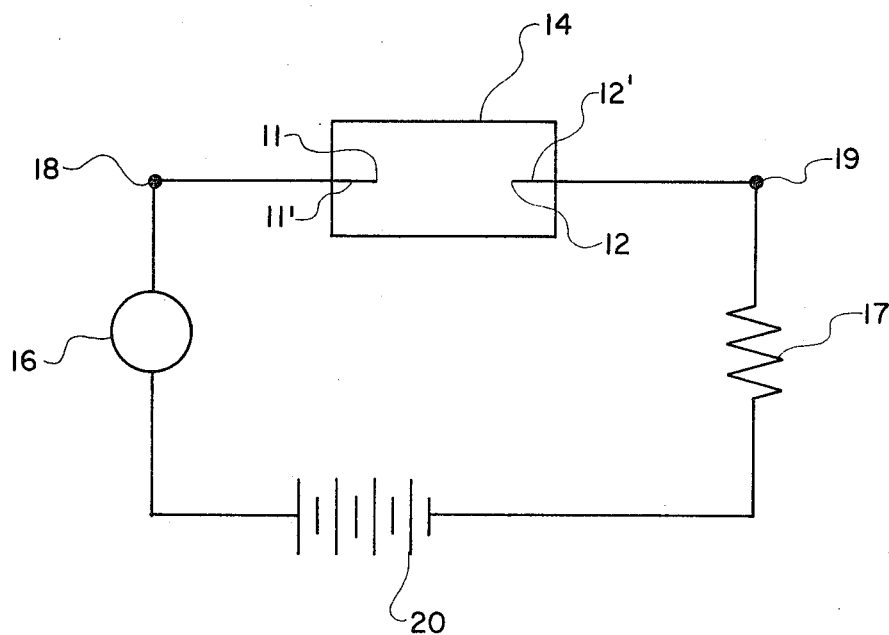
FIG. 8 is a schematic of a basic filament forming apparatus.

The basic components of the filament forming apparatus are schematically presented in FIG. 8.

The component indicated at 14 represents a container within which filaments are formed; it may also represent a surface onto which filaments are formed. The container or substrate material should possess the properties of an electrical insulator for reasons hereinafter set forth.

A mixture of molten conductor, which can be rendered superconducting, or nearly so, at normal ambient temperatures, and insulator is introduced between the points 11 and 12 within or onto component 14.

An appropriate DC voltage from a source 15 is applied across electrodes 11' and 12' to create an electric field between points 11 and 12. Particles of conducting material align between these termination points 11 and 12 of electrodes 11' and 12' respectively due to the electric field existing between said termination points. The voltage is maintained across the electrode ends until such time as the entire, once-molten mixture becomes completely solidified. What results are thin conducting filaments formed within and supported by a completely solid insulator.

The function of ammeter 16 is to indicate when continuity is established in the filament forming circuit and to record the magnitude of current passing through the circuit. Resistor 17 is a current-limiting component which serves to restrict the magnitude of charge transfer along the newly forming filaments. The passage of between one and two milliamps through each filament has been found to result in the formation of excellent filaments; this suggestion, however, is not intended to exclude other possibilities. What is important is that sufficient current be passed along newly-forming filaments to cause them to become thin solid wires threading through a solid insulating and supporting material.

The terminals designated 18 and 19 are components by which voltage from source 20 is supplied to electrodes 11' and 12' respectively. If 11' and 12' represent single electrodes, terminals 18 and 19 would simply be the points to which leads of opposite potential from the basic electrical energy supply circuit—consisting of voltage source 20, a current-limiting resistor 17, an ammeter 16, and associated component connecting conductors—are attached.

If 11' and 12' represent a multiplicity of electrodes providing for the formation of numerous filaments between opposite electrode points simultaneously, then terminals 18 and 19 can represent conducting plates to which the electrodes are attached, or it can represent the point at which each electrode is connected to the energy supply. What is important for the formation of a multiplicity of filaments is to provide a potential at point or points 11 that is opposite to the potential at point or points 12. The creation of fields of sufficient intensity will result in the simultaneous formation of numerous filaments as the conductor particles migrate between electrode termination points.

Should it be desirable to form filaments of lengths beyond those that can be produced by the action of the electric field, or fields, alone, one electrode can be retracted with respect to another, or both can be retracted, under the continued application of voltage. It has been found that increase in filament length by a process of electrode retraction is a function of increased applied voltage. What is important is to maintain the continued migration of conductor particles as the distance of separation between electrode termination points 11 and 12 is increased.

The molten mixture of conductor and insulator is prepared by either of the following methods. The conductor can be melted within a molten insulator, such as amorphous glass, although this choice of insulator is not intended to exclude other insulator materials. A ten to fifteen percent by volume mixture of conductor to insulator has been found to be adequate for filament formation, although other ratios are not excluded. The introduction of the well-stirred, nearly homogeneous molten mixture between electrode points 11 and 12, across which voltage is applied, will result in the formation of thin filaments, as above described.

The mixture may also be prepared by heating a fine powder form of conductor material within a molten insulator to high temperatures until the particles have been reduced to the desired cross-sections. Certain epoxy resin melting compounds have been used as insulator material for this method with excellent results, although this suggestion is not meant to exclude the employment of other insulator materials. Introduction of this mixture between points 11 and 12 under applied voltage will also result in permanent solid filaments within a solid insulator.

The choice of conductor materials for the filaments is restricted to those materials that can be rendered superconducting, or nearly so, at normal ambient temperatures. It has been found that conducting materials that contribute very few electrons to the conduction process per unit volume, and that do not possess a resistivity to correspond to the low conduction electron contribution, are those that will exhibit superconducting behavior as current is passed along very thin filaments made of the materials. In bismuth, for example, the conduction electron contribution is of the order of one per hundred thousand atoms, yet the metal's resistivity at normal temperatures is about $10^{-4}$ ohm-cm. For comparison, copper contributes one conduction electron per atom, and its resistivity at normal temperatures is about $10^{-6}$ ohm-cm. The conduction electron contribution of bismuth is of the order of one-hundred-thousandths that of copper, yet bismuth's resistance to current flow is only one hundred times greater than that of copper's. Based on its conduction electron contribution, it would be reasonable to expect that bismuth ought to be of the order of 100,000 times more resistive than copper, but the fact that it is only 100 times more resistive than copper places it in the category of normal ambient temperature superconductive materials. If n is the ratio of conduction electrons contributed per quantity of atoms, an order of magnitude for bismuth yields $$n = \frac{1 \text{ conduction electron, } e^-}{10^5 \text{ atoms}} = 10^{-5} e^-/\text{atom} \quad (12)$$

If n is multiplied by the material's resistivity, $\rho$, at normal ambient temperatures, we have an order of magnitude for bismuth of $$n\rho = 10^{-5} \frac{e^-}{\text{atom}} \times 10^{-4} \text{ ohm} - \text{cm} \quad (13)$$

$$n\rho = 10^{-9} \frac{\text{ohm} - \text{cm} - e^-}{\text{atom}}$$

It appears that the elements possessing desirable products are those designated the metalloids, although some alloys and metallic compounds can also be used as filament materials. The use of bismuth for the filament material is attractive due to its low melting point (271.3° C.), its nonhazardous property, and its $3\frac{1}{3}\%$ expansion on solidification. Bismuth's expansion on cooling assures that the ends of the formed filaments will not become disengaged from the electrode termination points 11 and 12 of FIG. 8.

The following is an example of the method of producing one specific type of fiber which exhibits properties of electrical superconductivity at ambient room temperature.

An insulating material such as epoxy resin is heated to approximately 280° Centigrade for at least fifteen minutes. Depending on the application and use of the product being formed, a hardening catalyst can be added at this time. Next a conducting material is added to the liquid insulator. When Bismuth is used as the conductor, this is added at 10 to 15 percent by volume to the insulator. The insulator and conductor are well mixed to an almost homogeneous solution and the mixture is then heated to a temperature of between 280° and 310° Centigrade for a period of from one to three hours. This heating reduces the size of the conductor particles to colloidal dimensions having diameters of less than 10,000 Å.

Preferably a flat plate type electrode corresponding to 11 in FIG. 8 is provided within the insulator/conductor solution. Once this solution has been heated as described above, one or more pin type electrodes corresponding to 12 of FIG. 8 are placed in the solution near electrode 11 while a voltage of between 800 and 1100 volts at between 0.5 and 2 milliamps is being applied. When the electrodes approach to within 0.15 to 3 millimeters of each other, they will generate an intense field to cause the conductor material to align between such electrodes thus forming a filament. A voltmeter can be provided within the voltage circuit to tell when continuity is established which takes only a few seconds.

By the above process, the filaments formed are only between 1.5 and 3 millimeters in length. The voltage required to establish longer filaments very quickly becomes impractical as compared to the small increased length obtainable.

To overcome the above length limitation and to form filaments of lengths greater than that which can be produced by the electrical field alone, the electrodes are moved apart from each other in a linear motion. It has been determined that a rate of approximately 0.5 millimeter per minute allows filaments up to 1 centimeter to be produced while still maintaining applied voltage in the 800 to 1100 volt range.

Although filaments of up to 1 centimeter have been produced by the method hereinabove described, greater lengths can, of course, be produced with the real limiting factor being determined largely by the solidifying properties of the surrounding fluid insulator material.

The applied voltage is maintained throughout the forming period which, using epoxy resin, ordinarily ranges between 30 and 45 minutes. As indicated above, a harden catalyst can be used as determined appropriate although in many instances is not necessary because of the heat applied during the process.

Due to random distribution of impurities within the conductor powder, some filaments have been found not to initially exhibit the desired conductivity after formation. It has been determined that through the application of between 200 and 600 volts with a current of up to 100 milliamps across such filaments will order the lattice structure of the same and sufficiently decrease its resistivity to provide the desired conductivity approaching that of superconductivity.

It is obvious from the above that an advantage of the present invention is that the conducting behaviors which have until this invention been obtained only at extremes of low temperatures can now be obtained at normal temperatures. A further advantage is the elimination of the need of expensive and high-energy consuming refrigeration devices to obtain low resistive high velocity electron flows. Since power dissipation by electrical conductors is the product of current squared and resistance ($I^2R$), a still further advantage is to provide for large charge transfer with low power dissipation. An even further advantage is to provide means by which changes in electron flow velocities can be effected at normal temperatures to transfer heat.

The present invention may, of course, be carried out in other specific ways than those herein set forth without departing from the spirit and essential characteristics of the invention. The present embodiments are, therefore, to be considered in all respects as illustrative and not restrictive and all changes coming within the meaning and equivalency range of the appended claims are intended to be embraced therein.

What is claimed is:

1. The process of forming filaments which exhibit properties associated with superconductivity at ambient temperatures comprising: suspending a conductor material within a fluid insulator material; heating at least the conductor material to reduce particulate size to colloidal dimensions; providing at least two electrodes within said conductor/insulator fluid; applying a voltage across said electrodes whereby conductor filaments are formed therebetween; and linearly moving said electrodes apart while continuing to apply voltage thereacross whereby extended filament length can be obtained.

2. The process of claim 1 whereby the conductor material is in the form of a fine powder.

3. The process of claim 1 wherein said conductor material is bismuth.

4. The process of claim 1 wherein said fluid insulator material is an epoxy resin.

5. The process of claim 1 wherein said conductor material is heated to between 280 and 310 degrees Centigrade for a period of from 1 to 3 hours.

6. The process of claim 1 wherein the reduced colloidal dimensions of the conductor material particulate in size is less than 10,000 Å.

7. The process of claim 1 wherein at least one of said electrodes is of the flat plate type.

8. The process of claim 7 wherein at least one of said electrodes is of the pin type.

9. The process of claim 1 wherein the voltage applied across said electrodes is between 800 and 1100 volts at between 0.5 and 2 milliamps.

10. The process of claim 1 wherein the linear movement of the electrodes away from each other is at a rate of approximately 0.5 millimeter per minute.

11. The process of claim 1 wherein between 200 and 600 volts and up to 100 milliamps is applied across filaments which do not exhibit the desired conductivity to order the lattice structure of the same and to provide the desired conductivity approaching that of superconductivity.

* * * * *